United States Patent
Grover

(10) Patent No.: US 8,310,798 B2
(45) Date of Patent: Nov. 13, 2012

(54) ACTIVE MONOSTABLE POSITIVE TRANSIENT PROTECTION CIRCUIT FOR A CAPACITIVE LOAD

(75) Inventor: Jason Grover, Chicago, IL (US)

(73) Assignee: Continental Automotove Systems, Inc., Auburn Hills, MI (US)

( * ) Notice: Subject to any disclaimer, the term of this patent is extended or adjusted under 35 U.S.C. 154(b) by 485 days.

(21) Appl. No.: 12/564,797

(22) Filed: Sep. 22, 2009

(65) Prior Publication Data

US 2011/0068849 A1   Mar. 24, 2011

(51) Int. Cl.
*H02H 3/22* (2006.01)
(52) U.S. Cl. .................... 361/111; 361/56; 361/91.1
(58) Field of Classification Search .......... None
See application file for complete search history.

(56) References Cited

U.S. PATENT DOCUMENTS

| | | | | |
|---|---|---|---|---|
| 4,020,395 A | * | 4/1977 | Erickson et al. | 361/59 |
| 5,670,865 A | * | 9/1997 | Farwell | 323/285 |
| 7,800,878 B2 | * | 9/2010 | Komatsu et al. | 361/93.1 |
| 2007/0285854 A1 | * | 12/2007 | Rodgers et al. | 361/56 |
| 2010/0172063 A1 | * | 7/2010 | Liu et al. | 361/118 |

FOREIGN PATENT DOCUMENTS

JP   2005321288   * 4/2004

OTHER PUBLICATIONS

Mitter, C.S., Active Inrush Current Limiting Using MOSFETs, Motorola Semiconductor Application Note AN1542, 1995, Motorola Literature Distribution, P.O. Box 20912; Phoenix, AZ 85036.

* cited by examiner

*Primary Examiner* — Jared Fureman
*Assistant Examiner* — Terrence Willoughby

(57) ABSTRACT

An electrically noisy D.C. power source having high slew rate A.C. transient voltage, is cut off from a capacitive load by a switchable, constant slew rate voltage source, upon the detection of an A.C. transient voltage having a slew rate that would otherwise cause a current overload through the capacitive load or the voltage source, or the D.C. power source.

12 Claims, 2 Drawing Sheets

Topology Block Diagram

Functional State Diagram

ACTIVE MONOSTABLE POSITIVE TRANSIENT PROTECTION CIRCUIT FOR A CAPACITIVE LOAD

BACKGROUND

Automotive electrical systems are known to be particularly noisy. Even though power in an automotive system is ostensibly drawn from a battery, electrical transients are created by inductive devices that turn on and off as well as the charging system itself.

Voltage transients are well known to have widely varying slew rates. The amplitude of voltage transients can also be quite high. Transients having slew rates of 80,000 volts per second (100 microseconds rise time) and pulse durations of several milliseconds or more are not uncommon.

Those of ordinary skill in the art know that high slew rate, high-amplitude transients can wreak havoc on electrical devices used in automobiles and trucks, especially the semiconductors used in vehicle engine and vehicle fuel system control computers, air bags and other occupant restraint systems and vehicle entertainment systems, typical designs of which are well known to those of ordinary skill in the art and omitted for brevity. The power supply line for an integrated circuit has a distributed capacitance to ground. That distributed capacitance, and other lumped capacitances are electrically equivalent to short circuits during the occurrence of high frequency voltage transients. When they are applied to a capacitive load, the transients can cause currents to flow that can damage the capacitance, the source, as well as electrical devices connected between them.

A low pass filter can suppress high frequency transients but filters require bulky capacitors and inductors. An apparatus and method for effectively filtering high frequency, high voltage transients from capacitive loads would be an improvement in the prior art, especially if such an apparatus and method could be implemented in one or more semiconductor devices.

DETAILED DESCRIPTION

Figure 1:
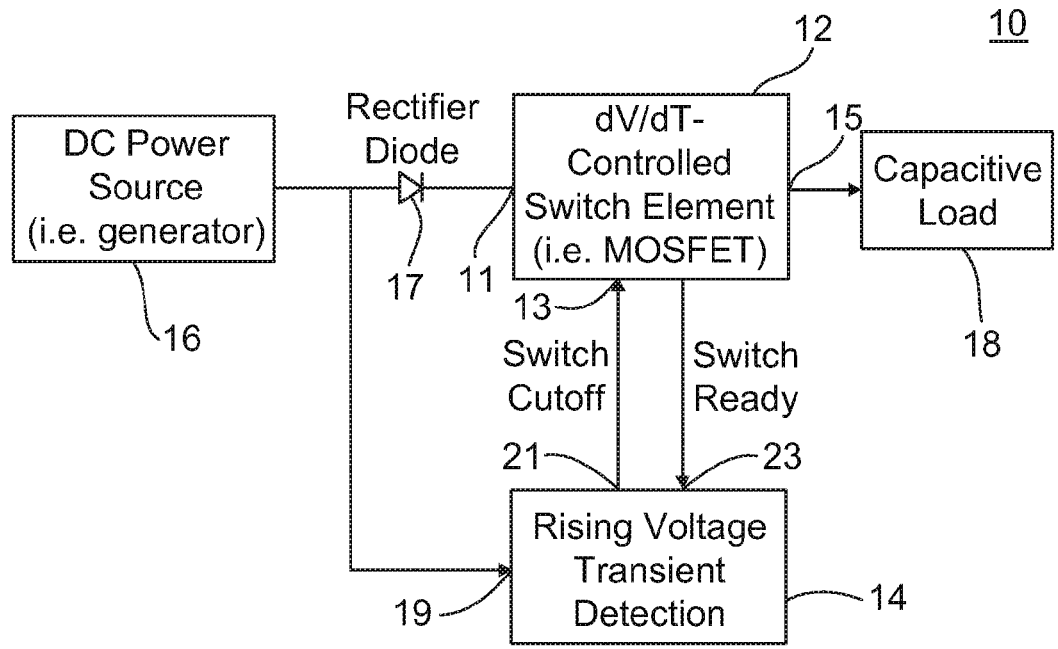
FIG. 1 is a block diagram of an active monostable positive transient protection circuit, a capacitive load, and a DC power source.

FIG. 1 shows a block diagram of an active monostable positive protection transient circuit 10. The circuit is comprised of a controlled slew rate, switchable voltage source 12, referred to hereafter as voltage source 12, and a transient voltage-triggered monostable multivibrator 14, referred to hereafter as the multivibrator 14.

The voltage source 12 has a power input terminal or node identified by reference numeral 11, which is connected to a direct current (D.C. or DC) power source 16 through a rectifier diode 17. The diode 17 prevents current from flowing into the D.C. power source 16 from a capacitive load to which the circuit 10 is connected. The circuit 10 is effective in isolating the DC power source 16 from capacitive load when the DC power source is electrically noisy, such as those found in trucks and automobiles.

The controlled slew rate switchable voltage source 12 has an output terminal or node 15 that delivers a controlled slew rate output voltage to a capacitive load 18. A capacitive load is typically embodied as one or more capacitor devices which exhibit electrical impedance that decreases as the rate of change of the applied voltage increases. A control input terminal 13, which is connected to a control output terminal 21 of the transient voltage-triggered monostable multivibrator 14 determines whether to connect or disconnect the controlled slew rate switchable voltage source 12 from the DC power source 16 in response to transients detected from said power source 16 on an input terminal 19 of the monostable multivibrator circuit 14. As set forth more fully below, the transient voltage-triggered monostable multivibrator 14 disables the controlled slew rate voltage source 12 when transients having a slew rate greater than a predetermined threshold rate are detected at the second controlled input terminal 19 of the monostable multivibrator circuit 14.

In a preferred embodiment, the control input terminal 19 of the monstable multivibrator circuit 14 is connected to a high pass filter. Those of ordinary skill in the electronic art know that low and high pass filters can be implemented using both digital and analog techniques. When an A.C. transient voltage from the DC power source 16 is determined to have a slew rate above a threshold value, as determined by the high pass filter cut off frequency, the monostable multivibrator circuit 14 generates an output signal on its control output terminal 21 that effectively opens the circuit path between the DC power source 16 and the capacitive load 18 that otherwise exists through the controlled slew rate switchable voltage source 12. The control signal on the control output terminal 21 stays active for a period of time determined by the time constant of the input high pass filter of the monostable multivibrator 14. After the A.C. transient voltage disappears from the power source 16, the monostable multivibrator 14 changes state in response to a switch ready control signal input to a control input terminal 23. The monostable multivibrator circuit 14 thus effectively disconnects the controllable slew rate switchable voltage source 12 so that transients having a slew rate greater than a first threshold value cannot pass through the voltage source 12 to the capacitive load 18 and risk causing an excessive current flow through the load 18, the voltage source 12, the DC power source 16 and/or the rectifier 17.

Figure 2:
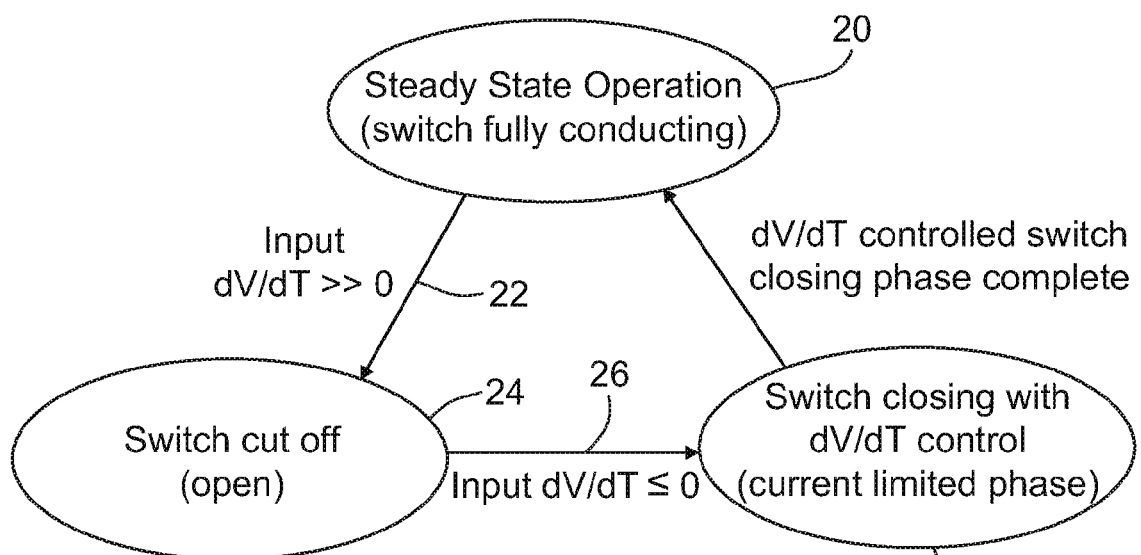
FIG. 2 is a state diagram of the circuit shown in FIG. 1.

FIG. 2 is a functional state diagram of the circuit shown in FIG. 1. In a first state 20, the controlled slew rate, switchable voltage source 12 is fully conducting. The DC power source 16 and current it produces flows through the rectifier diode 17, through the switchable voltage source 12 to the capacitive load 18 and other circuits beyond. When a transient appears on the DC power source 16, a state transition 22 to an open or cutoff state 24 occurs. In the cutoff state 24, the switchable voltage source 12 isolates the capacitive load 18 from the DC power source 16 for a period of time determined by the time constant of the monostable multivibrator 14.

When the transient disappears from the DC power source 16 and the time constant of the multivibrator has elapsed, a second state transition 26 occurs to state 28 during which the switchable voltage source 12 closes and provides a constant or controlled slew rate output voltage on its output terminal 15 to the capacitive load 18. From the third state 28, the circuit returns to its normal or steady state 20 when the time period of the controlled slew rate output voltage has elapsed.

In a preferred embodiment, transient voltages having slew rates above the threshold of the monostable multivibrator 14 will not continue to cutoff the switchable voltage source 12 during the time period when the switchable voltage source 12 closes and provides a constant or controlled slew rate output voltage on its output terminal 15. Stated another way, during the time that the output terminal 15 of the controlled slew rate switchable voltage source 12 is coming up to its normal operating voltage, transients from the DC power source 16 can pass through the rectifier diode 17 to the power input terminal 11 of the switchable controlled slew rate voltage source 12, and the switchable voltage source 12 will control the slew rate that is passed from the output terminal 15 to the capacitive load 18.

Figure 3:
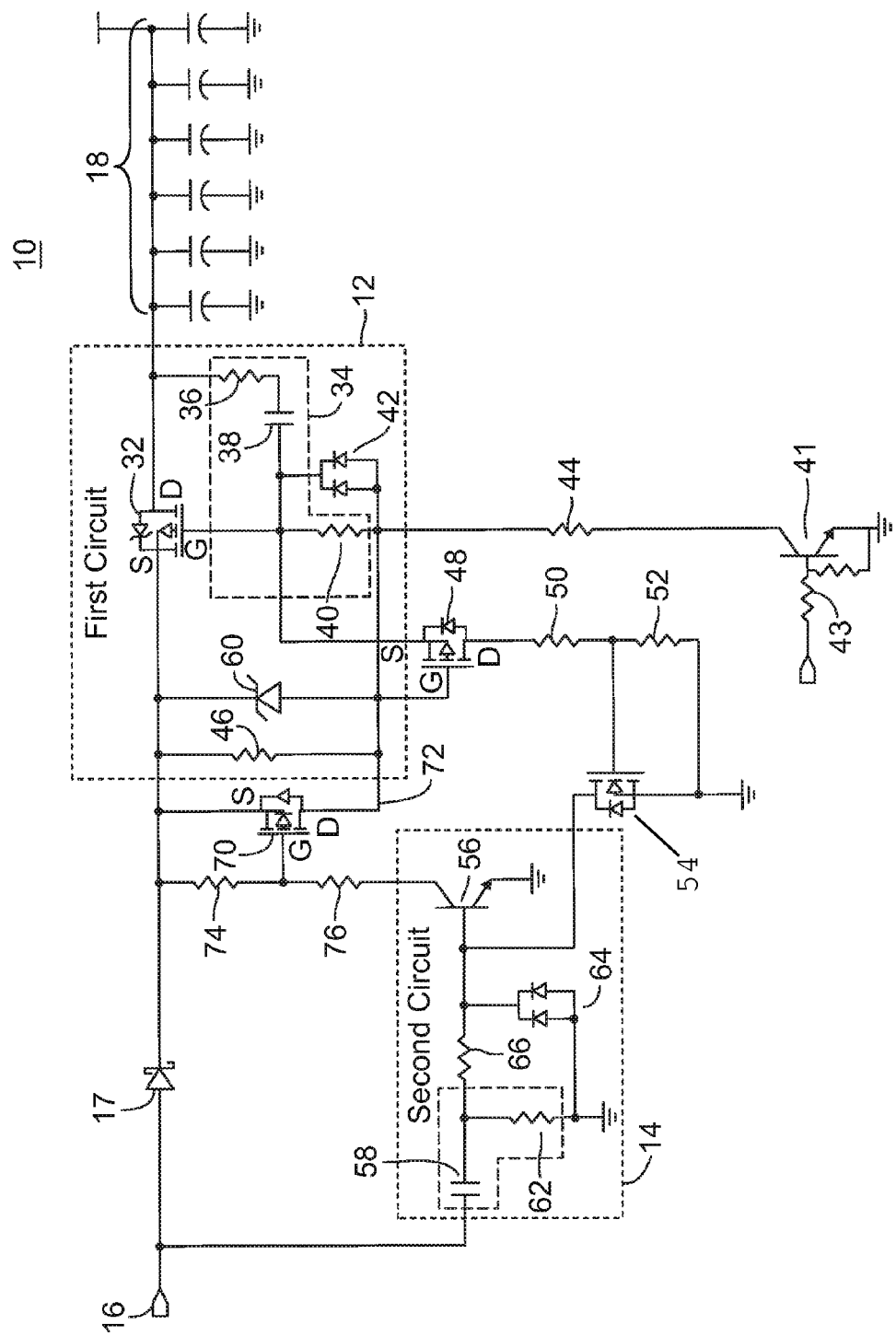
FIG. 3 is a schematic of a preferred embodiment of the active monostable positive transient protection circuit for a capacitive load shown in FIG. 1.

FIG. 3 is schematic diagram of a preferred embodiment of a active monostable positive protection transient circuit 10. The circuit 10 is comprised of a switchable voltage source 12, which is itself comprised of a P-channel power MOSFET transistor 32, the source terminal of which is connected to the DC power source 16 through the aforementioned rectifier diode 17. The drain (D) of the P-channel power MOSFET transistor 32 is connected to a capacitive load 18, represented in FIG. 3 as several discrete capacitors connected in parallel. The gate terminal (G) of the P-channel power MOSFET transistor 32 is connected to the drain through an output voltage slew rate feedback network 34 comprised of resistor 36 connected in series with capacitor 38 and resistor 40 coupled to ground through a circuit enabling transistor or switch 41 embodied as bipolar junction transistor.

When external control logic intends for the switchable voltage source 12 to be connected between the D.C. power source 16 and the capacitive load 18, it holds the voltage at base terminal 43 of the biased NPN bipolar junction transistor 41 continuously "high", turning on transistor 41 and thus biasing the control node 72 via resistors 44 and 46 and clamping zener diode 60.

The slew rate feedback network 34, embodied in FIG. 3 as resistors 36 and 40 and capacitor 38, provides a negative feedback signal to the gate terminal of transistor 32. If the output voltage on the drain increases too quickly, a corresponding voltage increase is applied to the gate of transistor 32, utilizing the transconductance characteristic of transistor 32 to limit the current that is sourced to the capacitive load 18 and slow the rate at which the drain terminal voltage increases. The output voltage slew rate of transistor 32 is therefore controlled by the time constant of resistors 36 and 40 and capacitor 38 so that the output voltage slew rate does not cause an excessive current to flow into the capacitive load 18 and/or through transistor 32 and/or the components between transistor 32 and the DC power source 16. One or more bypass diodes 42 coupled across resistor 40 allow the gate terminal to be driven "high" quickly by the surrounding bias network, bypassing the time constant of resistor 40 and capacitor 38 so that transistor 32 can be shut off as quickly as possible.

When a high frequency A.C. transient voltage appears on the DC power source 16, the high pass filter embodied as capacitor 58 and resistor 62 on the input node (and inside) of the monostable multivibrator 14 biases bipolar junction transistor (BJT) 56 via bias resistor 66, turning on BJT 56. Turning on BJT 56 pulls the voltage on the gate terminal of the P-channel MOSFET transistor 70 low via bias resistors 74 and 76, which causes the transistor 70 to conduct. Node 72, which is the drain terminal of MOSFET 70, goes high, which turns off the P-channel MOSFET transistor 48 while it drives the voltage on the gate G of transistor 32 high through the bypass diode 42, turning off transistor 32. A transient voltage at the input port 19 of the monostable multivibrator 14 thus causes the voltage source 12 to be disconnected from the capacitive load 18, and hence the capacitive load 18 is disconnected from the DC power source 16, by shutting off transistor 32 for a length of time (i.e., a time period) determined by the duration of the A.C. voltage transient and the time constant of the high pass filter in the monostable multivibrator 14.

When there is no longer any high frequency A.C. transient present on the D.C. power source 16, BJT 56 is no longer turned on by the high pass filter of capacitor 58 and resistor 62, and thus BJT 56 and P-channel FET 70 turn off. This allows node 72 to return to its steady state biased voltage dependent on resistors 44 and 46 and zener diode 60. This in turn causes the voltage at the gate terminal of transistor 32 to fall towards its steady state bias point, turning on the output voltage at the drain terminal of transistor 32. As the drain voltage of transistor 32 rises, the negative feedback network 34 causes the gate voltage of transistor 32 to maintain a constant voltage corresponding to the constant current that power source 12 is sourcing to the capacitive load 18. At this point the voltage difference between the gate of transistor 32 and node 72 causes P-channel FET 48 to turn on, which drives the voltage at the gate terminal of N-channel FET 54 high via bias resistors 50 and 52. This causes N-channel FET 54 to pull the base terminal of BJT 56 to ground, which forces P-channel FET 70 to stay off. When the drain voltage of transistor 32 has stopped rising and reaches its steady state value, P-channel FET 48 and N-channel FET 54 turn off. Thus the feedback circuit comprised of the P-channel MOSFET 48, resistors 50 and 52 and N-channel MOSFET 54 both enables and disables the monostable multivibrator 14 depending on the state of the slew controlled voltage source 12. That feedback circuit thus prevents the monostable multivibrator from cutting off the voltage source 12, during the time when the voltage source 12 is turning on or "ramping up" its output voltage. This allows the voltage source 12 to fully recharge the capacitive load 18 before being cut off by a subsequent transient, thus preventing a repetitive A.C. transient voltage from permanently cutting off the voltage source 12 from the capacitive load 18 and circuits beyond.

The value of bias resistor 66 is chosen to limit the maximum current that flows into the base terminal of BJT 56. Clamp diode 64 protects the base terminal of BJT 56 from negative-going transient voltages.

The values of bias resistors 74 and 76 are chosen to scale down the maximum voltage difference between the gate and source terminals of the transistor 70 to prevent this voltage difference from exceeding the maximum allowable gate to source voltage rating.

The values of bias resistors 44 and 46 and zener diode 60 are chosen to scale down and clamp the maximum voltage difference between the gate and source terminals of transistor 32 to prevent this voltage difference from exceeding the maximum allowable gate to source voltage rating.

The values of bias resistors 50 and 52 are chosen to scale down the maximum voltage difference between the gate and source terminals of the transistor 54 to prevent this voltage difference from exceeding the maximum allowable gate to source voltage rating.

In the embodiment shown in FIG. 1 and FIG. 3, the rectifier diode 17 connected in series between the D.C. voltage source 16 and the controlled slew rate switchable voltage source 12, prevents current from flowing from a capacitive load 18, back to the DC voltage source. It also prevents negative-going transients from coupling into the controlled slew rate switchable voltage source 12, the capacitive load 18, and other circuits beyond.

Those of ordinary skill in the art will recognize that the time constant of the high pass filter in the monostable multivibrator 14, and thus the minimum slew threshold of the transient voltages from the D.C. source 16 that will be cut off from the capacitive load 18, will be determined by capacitor 58 and resistor 62 values. Those values are preferably selected to turn off the voltage source 12, when an A.C. voltage transient would cause the conduction of an A.C. transient current through the voltage source 16 and/or capacitive load 18 in excess of the rated capacity of either the voltage source 12 or the capacitive load 18 and their corresponding components. Different time constants in the high pass circuit of capacitor 58 and 62 might therefore be required to protect one or the other of the voltage source 12 and the capacitive load 18 depending on their respective current-carrying ratings.

Those of ordinary skill in the art will also recognize that clamping diode 17 will also have a maximum current rating. The high pass filter constant inside the multivibrator 14 can therefore also be selected to shut off the voltage source 12 before the rated capacity of the diode 17 is reached, thereby limiting the current that flows through diode 17 to be below its rated capacity.

While the preferred embodiment shown in FIG. 3 uses a P-channel MOSFET, alternate embodiments can include the use of an N-channel as well as a bipolar junction transistor. The monostable multivibrator 14 and the logical enable switch 41 depicted in FIG. 3 both use NPN bipolar junction transistors; however, an PNP bipolar junction transistor or at least one of a P-channel or N-channel field effect transistor could also be substituted with appropriate modifications of the bias circuitry taken into consideration.

The foregoing description is for purposes of illustration only. The true scope of the invention is defined by the appurtenant claims.

What is claimed is:

1. A switch comprising:
a first circuit having a first power input (first input), a first control input (first control input) and a power output (power output), the power output having a controlled voltage slew rate, the first input being coupled to a D.C. voltage source that includes A.C. transient voltages;
a second circuit, having a second power input (second input), a second control input (second control input) and a control output (control output), the second input being coupled to the D.C. voltage source, the second circuit detecting A.C. transient voltages having slew rates above a first threshold and thereafter generating a signal from the control output to the first control input to cut off the first circuit in response thereto;
wherein the second circuit is disabled by the first circuit for a finite time, based on a state of the first circuit.

2. The switch of claim 1, further comprising a capacitive load coupled to the power output of the first circuit.

3. A switch comprising:
a first circuit having a first power input (first input), a first control input (first control input) and a power output (power output), the power output having a controlled voltage slew rate, the first input being coupled to a D.C. voltage source that includes A.C. transient voltages;
a second circuit, having a second power input (second input), a second control input (second control input) and a control output (control output), the second input being coupled to the D.C. voltage source, the second circuit detecting A.C. transient voltages having slew rates above a first threshold and thereafter generating a signal from the control output to the first control input to cut off the first circuit in response thereto;
wherein the first circuit comprises a transistor having an output voltage slew rate feedback network coupled between the power output and the first control input; and
the second circuit comprises a transistor having an input control terminal A.C. coupled to the D.C. voltage source through a capacitance.

4. The switch of claim 3, wherein said second circuit includes a high-pass filter, which determines a threshold of A.C. transient voltage slew rates that the second circuit will act upon to cut off the first circuit.

5. The switch of claim 4, further including a voltage clamping diode between the high-pass filter and transistor, the clamping diode being coupled between the input control terminal of the transistor and a reference potential for the second circuit.

6. A switch comprising:
a first circuit having a first power input (first input), a first control input (first control input) and a power output (power output), the power output having a controlled voltage slew rate, the first input being coupled to a D.C. voltage source that includes A.C. transient voltages;
a second circuit, having a second power input (second input), a second control input (second control input) and a control output (control output), the second input being coupled to the D.C. voltage source, the second circuit detecting A.C. transient voltages having slew rates above a first threshold and thereafter generating a signal from the control output to the first control input to cut off the first circuit in response thereto;
wherein the second circuit is configured to operate as a monostable multivibrator in response to the state of the first control input of the first circuit.

7. A switch comprising:
a first circuit having a first power input (first input), a first control input (first control input) and a power output (power output), the power output having a controlled voltage slew rate, the first input being coupled to a D.C. voltage source that includes A.C. transient voltages;
a second circuit, having a second power input (second input), a second control input (second control input) and a control output (control output), the second input being coupled to the D.C. voltage source, the second circuit detecting A.C. transient voltages having slew rates above a first threshold and thereafter generating a signal from the control output to the first control input to cut off the first circuit in response thereto;
wherein the first circuit comprises a transistor having a control input terminal, and further comprises a feedback circuit coupled between the control input terminal and the second circuit, whereby the state of the voltage on the control input terminal of the transistor in the first circuit enables and disables the second circuit.

8. The switch of claim 7, wherein the feedback circuit is configured to prevent the second circuit from cutting off the first circuit, during a period when the first circuit is turning on.

9. A switch of comprising:
a first circuit having a first power input (first input), a first control input (first control input) and a power output (power output), the power output having a controlled voltage slew rate, the first input being coupled to a D.C. voltage source that includes A.C. transient voltages;
a second circuit, having a second power input (second input), a second control input (second control input) and a control output (control output), the second input being coupled to the D.C. voltage source, the second circuit detecting A.C. transient voltages having slew rates above a first threshold and thereafter generating a signal from the control output to the first control input to cut off the first circuit in response thereto;

wherein the second circuit is configured to cut off the first circuit when an A.c, transient voltage from the D.C. voltage source would otherwise cause the conduction of an A.C. transient current through the first circuit to a capacitive load having a rated maximum current conduction capability.

10. A switch comprising:

a first circuit having a first power input (first input), a first control input (first control input) and a power output (power output), the power output having a controlled voltage slew rate, the first input being coupled to a D.C. voltage source that includes A.C. transient voltages;

a second circuit, having a second power input (second input), a second control input (second control input) and a control output (control output), the second input being coupled to the D.C. voltage source, the second circuit detecting A.C. transient voltages having slew rates above a first threshold and thereafter generating a signal from the control output to the first control input to cut off the first circuit in response thereto;

wherein the second circuit is configured to cut off the first circuit when an A.c, transient voltage from the D.C. voltage source would otherwise cause the conduction of an A.c, transient current through the first circuit from the D.C. voltage source in excess of a rated capacity of said D.C. voltage source.

11. A switch comprising:

a first circuit having a first power input (first input), a first control input (first control input) and a power output (power output), the power output having a controlled voltage slew rate, the first input being coupled to a D.C. voltage source that includes A.C. transient voltages;

a second circuit, having a second power input (second input), a second control input (second control input) and a control output (control output), the second input being coupled to the D.C. voltage source, the second circuit detecting A.c, transient voltages having slew rates above a first threshold and thereafter generating a signal from the control output to the first control input to cut off the first circuit in response thereto;

wherein the second circuit is configured to cut off the first circuit when an A.C. transient voltage from the D.C. voltage source would otherwise cause the conduction of an A.C. transient current through the first circuit from the D.C. voltage source in excess of a rated capacity of said first circuit.

12. A switch comprising:

a first circuit having a first power input (first input), a first control input (first control input) and a power output (power output), the power output having a controlled voltage slew rate, the first input being coupled to a D.C. voltage source that includes A.C. transient voltages;

a second circuit, having a second power input (second input), a second control input (second control input) and a control output (control output), the second input being coupled to the D.C. voltage source, the second circuit detecting A.c, transient voltages having slew rates above a first threshold and thereafter generating a signal from the control output to the first control input to cut off the first circuit in response thereto;

a diode coupled in series between the D.C. voltage source and the first circuit, the diode being configured to prevent current from flowing from a load coupled to the first circuit, back into the D.C. voltage source; and wherein the second circuit is configured to cut off the first circuit when an A.C. transient voltage from the D.C. voltage source would otherwise cause the conduction of an A.C. transient current through the diode coupled in series between the D.C. voltage source and the first circuit, in excess of a rated capacity of said diode.

* * * * *